United States Patent [19]

Muroyama

[11] Patent Number: 5,470,800

[45] Date of Patent: Nov. 28, 1995

[54] METHOD FOR FORMING AN INTERLAYER FILM

[75] Inventor: Masakazu Muroyama, Kanagawa, Japan

[73] Assignee: Sony Corporation, Tokyo, Japan

[21] Appl. No.: 37,645

[22] Filed: Mar. 26, 1993

[30] Foreign Application Priority Data

Apr. 3, 1992 [JP] Japan .................................. 4-081283
Jul. 24, 1992 [JP] Japan .................................. 4-218551

[51] Int. Cl.⁶ .................................................. H01L 21/02
[52] U.S. Cl. ............................................................ 437/238
[58] Field of Search .................... 437/238; 148/DIG. 118

[56] References Cited

PUBLICATIONS

*Webster's Ninth New Collegiate Dictionary.* (1985) pp. 463, 740.

*Primary Examiner*—R. Bruce Breneman
*Assistant Examiner*—Linda J. Fleck
*Attorney, Agent, or Firm*—Hill, Steadman & Simpson

[57] ABSTRACT

A process for forming an interlayer membrane by chemical vapor deposition comprises the steps of supplying gaseous materials to a reaction chamber in which a wafer to be deposited is installed, supplying a catalyst gas to the reaction chamber separately from but concurrently with the gaseous materials are supplied, and allowing the gaseous materials to react with the catalyst gas adjacent the surface of the wafer to form a membrane being laid on the wafer. The gaseous materials may include at least one organic silicone compound. The catalyst may be selected from water soluble catalysts having basicity, preferably, compounds having amino groups or hydrazine derivatives. The catalyst may be dissolved with water to a solution prior to supply. An apparatus for forming such interlayer membrane by chemical vapor deposition is composed of a reaction chamber in which a semiconductor substrate to be deposited, means for supplying gaseous materials communicated with the reaction chamber to supply the gaseous materials to adjacent the substrate in the reaction chamber, and means for supplying a catalyst communicated with the reaction chamber separately from the means for supplying gaseous materials to separately supply the catalyst to adjacent the substrate in the reaction chamber.

5 Claims, 4 Drawing Sheets

METHOD FOR FORMING AN INTERLAYER FILM

BACKGROUND OF THE INVENTION

1. Field of the Invention

The present invention relates generally to a process for forming an interlayer membrane for an electronic material using gaseous materials. Specifically, the present invention relates to a process for forming an interlayer membrane for a semiconductor device of which wirings are microrized and integrated, such as a memory device microrized and integrated. Alternatively, the present invention relates to an apparatus for forming such interlayer membrane.

2. Description of the Background Art

Recently, aluminum wirings formed on a semiconductor device has been more and more microrized and multilayered. Step difference between wirings and an interlayer insulating membrane present at a clearance of the wirings becomes larger and sharper according to such microrization and multilayering of the wirings, because the clearance becomes narrower. This causes deterioration of processing accuracy and reliability of the wirings. Therefore, flattening of the interlayer membrane laid on the wirings has been studied because step coverage of the wirings is difficult to be improved.

Conventionally, a chemical vapor deposition (hereinafter, a CVD) using an organic silane gas as one of a component of gaseous materials, for example, a plasma CVD, a vacuumed CVD and an atmospheric CVD, has been utilized to flatten an interlayer insulating membrane. Alternatively, variety of techniques have been utilized, such as configuring technique, e.g., bias sputtering and bias ECR-CVD, which chamfers the step of the wiring by sputter-etching during the membrane formation, coating technique to coat the membrane surface by an organic or inorganic spin on glass (SOG) membrane, and re-flowing technique softening the interlayer membrane by heat treatment to give flowability thereto. Etch back technique is also utilized to chamfer the step of the wiring for flattening.

When the techniques described as the above are applied to the wiring layer of microrized and multilayered, flattening of membrane at the wiring clearance of wide distance becomes not enough, and voids tend to be generated in the interlayer membranes at the clearance. Therefore, connection between wirings is deteriorated.

Flattening an interlayer insulating membrane on an aluminum wiring having high aspect ratio by the plasma CVD process using an organic silane of water added has been well known (refer to the 38th lecture scripts of the allied applied-physics institution, p 632, 29P-V-8 and 29P-V-9, 1991). However, when water is added, concentration of hydroxyl groups present in the membrane and that of by-produced alcohol are increased. Those cause certain increase of the rate of heat shrinkage during annealing resulted in crack generation on the membrane. Reliability of the multilayered wiring becomes deteriorated thereby.

Japanese Patent First Publication (not allowed) No. 3-116835 describes CVD using organic silane and inorganic acid as gaseous materials. Organic silane promotes hydrolysis reaction to reduce hydroxyl groups, and inorganic acid also reduces hydroxyl groups. However, when a proton donor, i.e., inorganic acid, is added, proton acts as a catalyst for hydrolysis to radically promote hydrolysis in the reaction system. This causes the concentration of hydroxyl groups in the system to be rapidly increased (refer to Journal of Non-Crystallin Solids, 63(1984), 13–21, North-Holland, Amsterdam). Shrinkage by the heat treatment and hygroscopicity of the membrane obtained are increased thereby.

Forming the membrane having high molecular weight allows the membrane to self-flow. Here, self-flowing is a phenomena of spontaneous flattening of the membrane free from specific flattening techniques. However, inorganic acid significantly increases the rate of hydrolysis in the system, therefore, product of low molecular weight causing inhibition of polymerization.

Additionally, in the conventional CVD process using a gaseous mixture, gaseous materials are sufficiently mixed prior to introduce in a reaction chamber to form the uniform membrane without delay. However, when a catalyst is added to the system, reaction between the catalyst and the gaseous materials is started immediately. Therefore, particles are formed in the conduit before the gases and the catalyst is introduced in the reaction chamber. Thus, membrane quality becomes deteriorated. Process for reducing desorption of the gases from the membrane has also been studied to raise membrane quality.

SUMMARY OF THE INVENTION

It is therefore a principal object of the present invention to provide a process for forming a flattened interlayer membrane having high quality.

It is additional object of the present invention to provide a process for forming a layer of an insulating membrane having high reliability even though wirings on the layer is microrized.

It is a further object to provide a process for forming an interlayer membrane having high molecular weight.

It is another object of the present invention to provide a process for forming a flattened interlayer membrane having low concentration of hydroxyl groups.

In order to accomplish the aforementioned and other objects, a process for forming an interlayer membrane by chemical vapor deposition comprises the steps of supplying gaseous materials to a reaction chamber in which a wafer to be deposited is installed, supplying a catalyst gas to the reaction chamber separately from but concurrently with the gaseous materials are supplied, and allowing the gaseous materials to react with the catalyst gas adjacent the surface of the wafer to form a membrane being laid on the wafer.

The gaseous materials may include at least one organic silicone compound.

The catalyst may be selected from water soluble catalysts having basicity, preferably, compounds including amino groups or hydrazine derivatives. The catalyst may be dissolved with water to a solution prior to supply.

According to another aspect of the present invention, a process for forming an interlayer membrane is composed of preparing gaseous materials including at least one organic silicone compound and an oxidant, depositing the gaseous materials to a surface of a wafer to be deposited, and depositing a catalyst separately from but concurrently with the gaseous materials are deposited, wherein the catalyst allows to react with the gaseous materials on the surface of the wafer to form an interlayer membrane being laid on the wafer.

The oxidant may be water.

A process for forming a semiconductor device of which interlayer insulating membranes are multilayered on a semiconductor substrate comprises the steps of laying a first insulating membrane on a semiconductor substrate by chemical vapor deposition of gaseous materials free from water, laying a second insulating membrane thereon by chemical vapor deposition of gaseous materials including at least one organic silicone compound, an oxidant and a catalyst having basicity, and laying a third insulating membrane thereon by chemical vapor deposition of gaseous materials free from water.

An excess amount of the second insulating membrane may be etched back prior to laying the third insulating membrane.

An apparatus for forming an interlayer membrane by chemical vapor deposition is composed of a reaction chamber in which a semiconductor substrate to be deposited, means for supplying gaseous materials communicated with the reaction chamber to supply the gaseous materials to adjacent the substrate in the reaction chamber, and means for supplying a catalyst communicated with the reaction chamber separately from the means for supplying gaseous materials to separately supply the catalyst to adjacent the substrate in the reaction chamber.

The organic silicone gas may be selected from the following compounds.

| Alkoxysilane group | |
|---|---|
| Tetraethoxysilane, e.g., TEOS (tetraethoxyorthosilane): | $Si(OC_2H_5)_4$ |
| Tetramethoxysilane: | $Si(OCH_3)_4$ |
| Tetraisopropoxysilane: | $Si(i-OC_3H_7)_4$ |
| Tetratertiarybutoxysilane: | $Si(t-OC_4H_9)_4$ |
| Alkoxyacethoxysilane group | |
| DADBS (Diisopropoxydiacethoxy-silane): | $Si(OC_3H_7)_2(OCOCH_3)_2$ |
| Chain polysiloxane group | |
| HMDS (hexamethyl disilosane): | $Si_2C_6H_{18}O$ |
| Cyclic polysiloxane group | |
| OMCTS (octamethyl cyclotetra-siloxane): | $Si_4C_8H_{24}O_2$ |
| TOMCATS (tetramethyl cyclotetra-siloxane): | $Si_4C_4H_{16}O_4$ |

The catalyst may be selected from catalysts of hydrogen ion concentration controllable, e.g., a catalyst having basicity. The compound having amino groups, such as ammonia, alkylamine, and hydrazine derivatives, are prefer to use.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings.

DESCRIPTION OF THE PREFERRED EMBODIMENT

Embodiment 1

An organic silicone compound, preferably Si alkoxide, as one of a component of gaseous materials, and a catalyst having basicity are applied to chemical vapor deposition to form an interlayer insulating membrane of a semiconductor device. The catalyst added to Si alkoxide during the membrane formation to promote a catalytic reaction thereof on a wafer to be coated with the membrane formed. CVD is accomplished by a conventional plasma CVD apparatus of parallel plate type. The catalyst and the gaseous materials are separately supplied to a reacting chamber of the apparatus.

Figure 1:
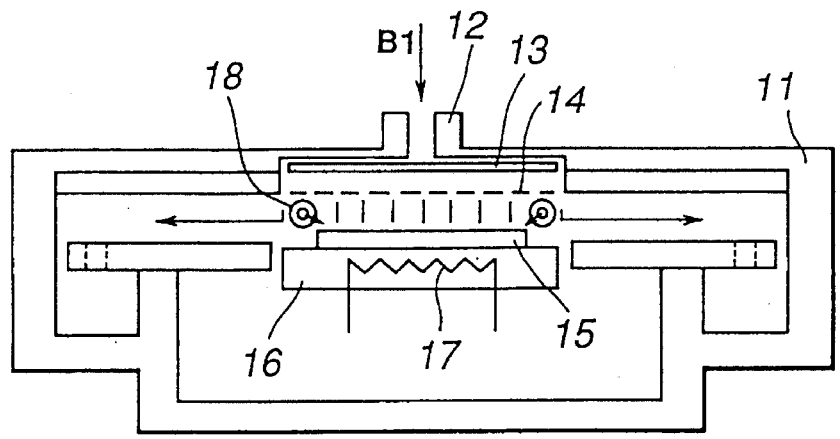
FIG. 1 is a schematic side view of a chemical vapor deposition apparatus for an Embodiment 1 of the present invention.

Referring now to FIG. 1, showing a CVD apparatus of the present embodiment, a reaction chamber 11 has a supply conduit 12 to supply an organic silicone compound, e.g., TEOS, and an oxygen gas as an oxidant from the direction of an arrow B1. A dispersing plate 13 and a shower head 14 to uniformly disperse the gases. A wafer 15 to be covered with an interlayer insulating membrane and a wafer mounting 16 is housed in the reaction chamber 11 to mount the wafer 15. A heater 17 is installed in the wafer 15 to maintain the wafer 15 at a predetermined temperature. Construction of the wafer mounting and usage thereof are not limited by the present embodiment.

A $H_2O$-TEOS plasma CVD apparatus is prefer to use. Ammonia ($NH_3$) as a basic catalyst is supplied to the reaction chamber 11 via a gas supply ring 18 installed therein. Thus, the catalyst can be directly supplied to the wafer surface. Therefore, dehydration condensation of $H_2O$-TEOS is effectively promoted to form an interlayer membrane having good quality.

An interlayer insulating membrane of the embodiment was formed under the following condition.

| Flow Rate of gases | |
|---|---|
| TEOS/$O_2$/$H_2O$/$NH_3$ = | 150/150/100/10 [sccm] |
| Pressure | 1330 [Pa] (10 torr) |
| Temperature | 150 [°C.] |
| RF | 350 [W] |

Figure 6:
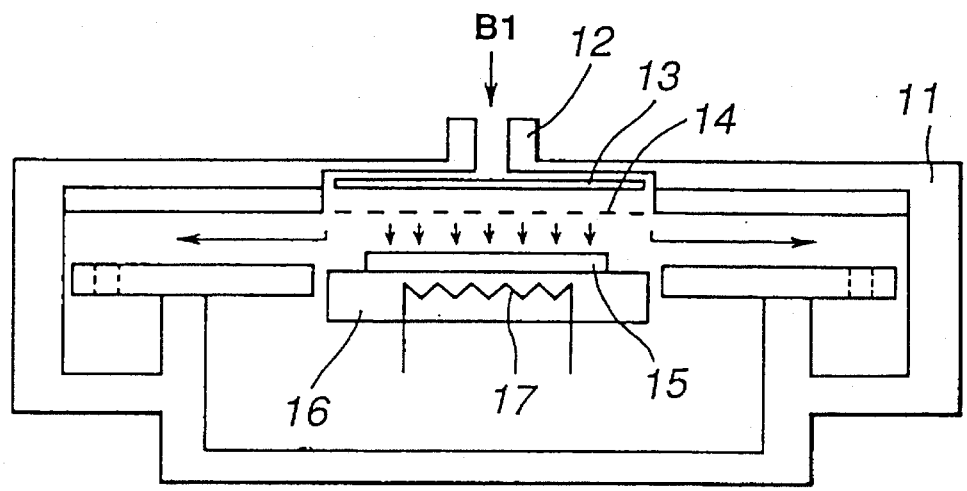
FIG. 6 is a schematic side view of a chemical vapor deposition apparatus of prior art.

Table 1 shows number of particles formed on the membrane of the present embodiment and that of conventionally formed using conventional apparatus of FIG. 6 (wherein same numerals indicates same portions). The $SiO_2$ membrane having 200 nm of thickness was formed on the wafer of 125 nm of diameter. Particles having more than 0.3 μm of diameter were measured.

TABLE 1

| Catalyst Introduction | Separated (Embodiment 1) | Non-separated (Conventional) |
|---|---|---|
| Number of Particles | 20 | 200 |

According to the present embodiment, the membrane having less particles thereon can be formed.

Embodiment 2

Figure 2:
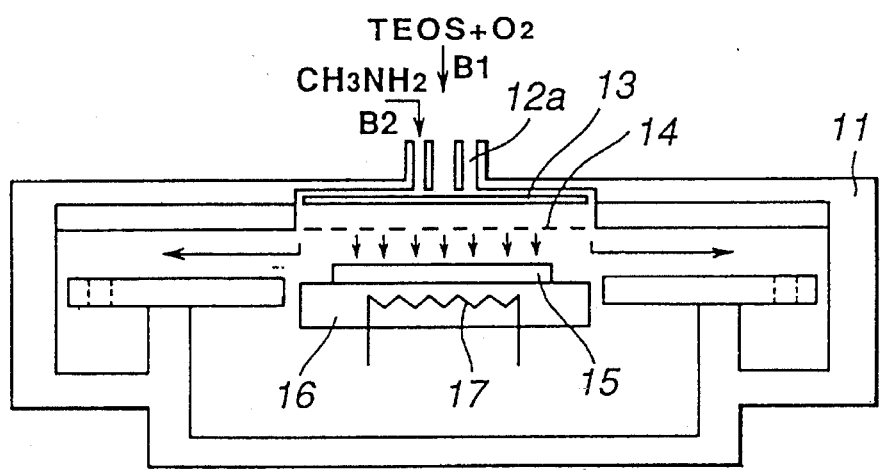
FIG. 2 is a schematic side view of a chemical vapor deposition apparatus for an Embodiment 2 of the present invention.

An interlayer insulating member was formed by the $H_2O$-TEOS plasma CVD similar to the Embodiment 1. Referring to FIG. 2, a double conduit 12a is installed as a supply conduit for a hydrolysis catalyst and gaseous materials in the reaction chamber 11. TEOS and $O_2$ as gaseous materials were supplied from the inner conduit of the double conduit 12a in the direction of an arrow B1, on the other hand, a solution of methyl amine ($CH_3NH_3$) as the catalyst was supplied from the outer conduit of the double conduit 12a in the reaction chamber 11. The interlayer insulating member was formed under the following conditions.

| | |
|---|---|
| Pressure | 1330 [Pa] (10 torr) |
| Temperature | 200 [°C.] |
| RF | 300 [W] |

According to the present embodiment, dehydration condensation is effectively promoted and the insulating membrane having good quality can be formed. As the basic organic catalyst, water soluble organic base, such as ethyl amine, isopropyl amine, may preferable, not limited by methyl amine.

Embodiment 3

Figure 3:
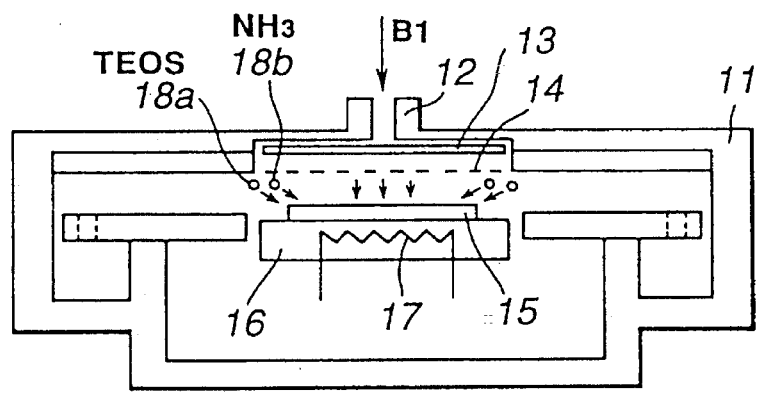
FIG. 3 is a schematic side view of a chemical vapor deposition apparatus for an Embodiment 3 of the present invention.

Referring to FIG. 3, two gas supply rings 18a and 18b are installed in the reaction chamber 11 to mix TEOS as the reaction gas with $NH_3$ as the catalyst gas adjacent the wafer at the nearest possible area. TEOS was supplied from the ring 18a and $NH_3$ was supplied from the ring 18b to the chamber 11. Both gases were mixed at the area between the shower head 14 and the wafer 15. According to the Embodiment 3, polymerization can be effectively promoted without forming particles.

Embodiment 4

Figure 4A:
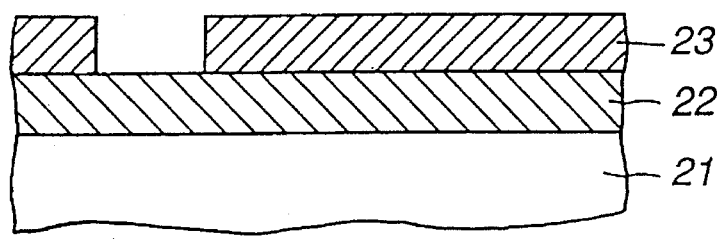
FIGS. 4(a) to (d) are side views showing a process for forming an interlayer membrane according to an Embodiment 4 of the present invention.
Figure 4B:
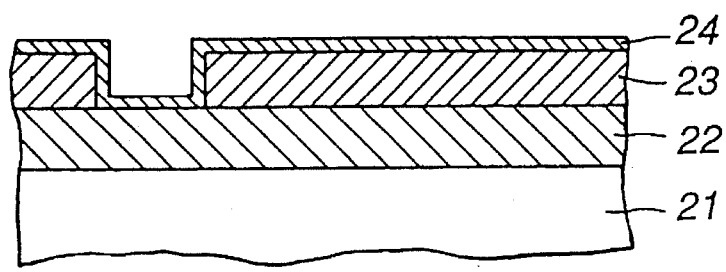
Figure 4C:
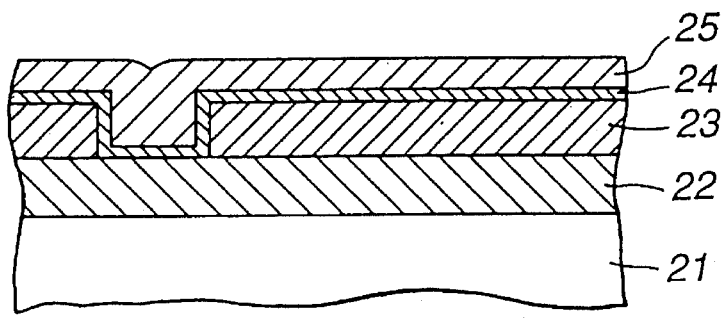

Referring now to FIG. 4(a), a wafer was prepared by a semiconductor substrate 21 of silicone or such materials on which an interlayer insulating membrane 22 formed of oxidized silicone or such materials and a layer of aluminum wiring 23. A first insulating membrane 24 was laid on the exposed surface of the interlayer insulating membrane 22 and the aluminum wiring 23 as shown in FIG. 4(b) to support quality of a plasma CVD membrane succeedingly laid by addition of an alkali solution.

The first membrane 24 was prepared by an organic silicone compound (here, tetraetoxysilane) under the following conditions using the apparatus of FIG. 1.

| Flow Rate of Gases | |
|---|---|
| $TEOS/O_2$ = 350/350 [sccm] | |
| Pressure | 1330 [Pa] (10 torr) |
| Temperature | 390 [°C.] |
| RF | 350 [W] |

Then, a second insulating membrane 25 of an insulating membrane was laid on the layer of the wiring 23 by adding an ammonia solution as an alkali solution under the following conditions;

| Flow Rate of Gases | |
|---|---|
| $TEOS/O_2/H_2O/NH_3$ = 350/350/10/50 [sccm] | |
| Pressure | 1330 [Pa] (10 torr) |
| Temperature | 120 [°C.] |
| RF | 350 [W] | wherein concentration of the ammonia solution was determined to 5%.

$TEOS/O_2$ and $NH_3$ solution were separately supplied from the individual supply conduit 12 and the supply ring 18, respectively. The mixing ratio of TEOS to $H_2O$ was regulated to $TEOS/H_2O=350/10$ in the present embodiment, however, that may be regulated in the range of $10/1 \leq TEOS/H_2O \leq 100/1$.

Additionally, concentration of the ammonia solution is not limited by 5%. Because the solution was added as the catalyst for the dehydration condensation, at least 0.1% of the solution to water may be preferable. Accordingly, the mixing ratio of TEOS to $H_2O$ is regulated, the ammonia solution of un-reacted is not remained in the second membrane 25. Therefore, deterioration of quality of the second membrane 25 caused by the ammonia solution can be prevented.

Figure 4D:
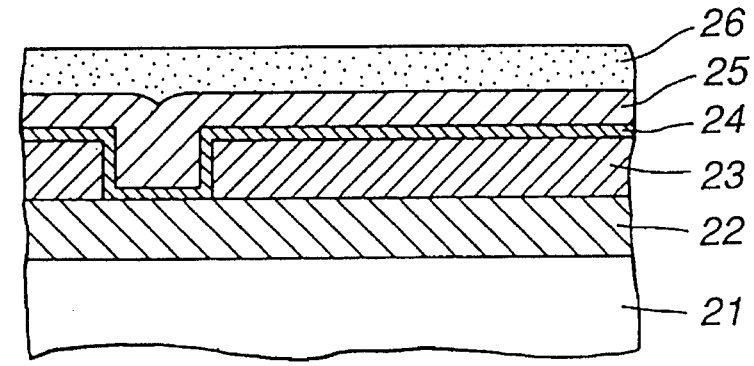

Then, a third membrane 26 was laid on the second membrane, as shown in FIG. 4(d), under the conditions similar as the first membrane 24 was laid. Thus, layering of membrane can be completed. The temperature may be determined more than 100° C. to sufficiently remove the ammonia solution added, and less than 500° C. to maintain reliability of the aluminum wiring layer. The temperature range from 100° to 200° C. may be most preferable as self-flowing of the third membrane is occurred under low temperatures of less than 200° C. The organic silicone compound may be selected from OMCTS (octamethyl cyclotetrasiloxane), TPOS (tetrapropoxysilane), and TMCTS (tetramethyl cyclotetrasiloxane), not limited by tetraethoxysilane.

Embodiment 5

Figure 5A:
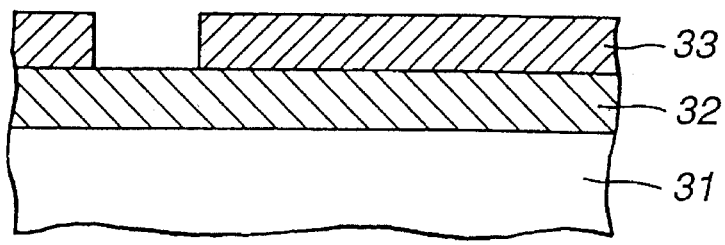
FIGS. 5(a) to (d) are side views showing a process for forming an interlayer membrane according to an Embodiment 5 of the present invention.

The second insulating membrane prepared by the Embodiment 4 was etched back. Thus, the second membrane is remained only at the clearance of the wiring by removal of an excess amount thereof on the surface of the wiring layer. Because the second membrane has less quality than the interlayer insulating membranes conventionally formed. Referring now to FIG. 5(a), a wafer was prepared by a semiconductor substrate 31 formed of silicone or such materials on which a layer of an insulating membrane 32 of oxidized silicone or such materials and an aluminum wiring layer 33 are successively formed. The aluminum wiring layer 33 was etched by a resist process.

Figure 5B:
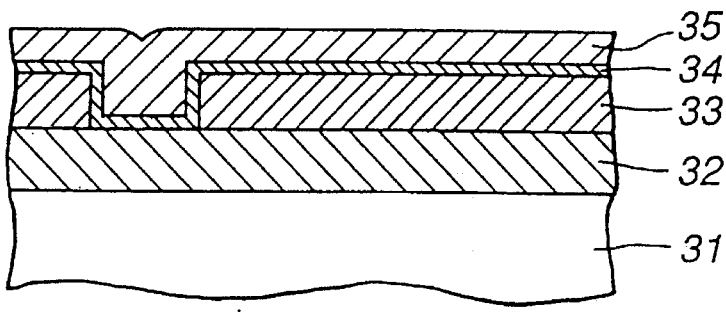

A first insulating membrane 34 was laid on the wafer, as shown in FIG. 5(b), similar to that of the Embodiment 1 using the apparatus of FIG. 1. A solution of $CH_3NH_2$ as an organic alkali solution was added by the bubbling process to lay a second insulating membrane 35.

Figure 5C:
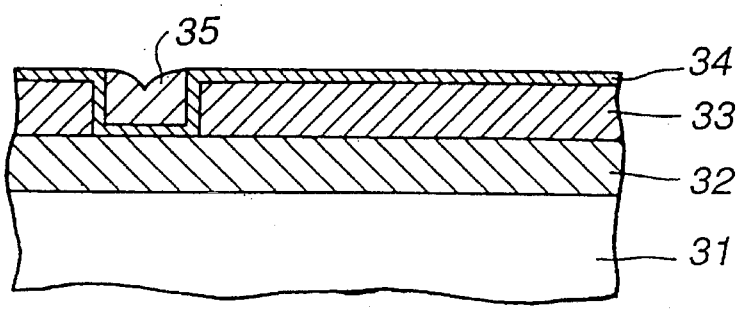
Figure 5D:
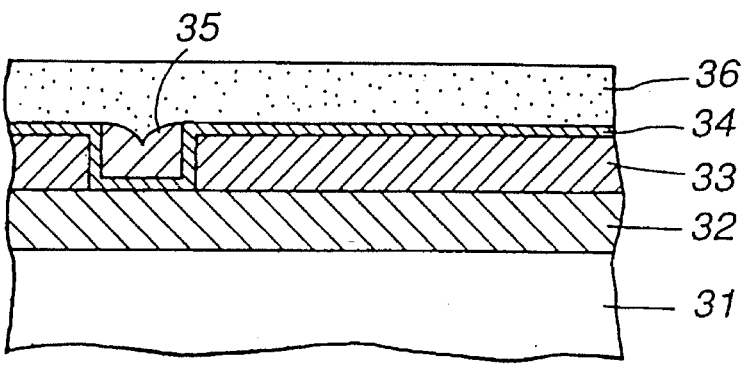

Then, an excess amount of the second membrane 35 was removed by etching. The membrane 35 was only remained at the clearance of the aluminum wiring 33 as shown in FIG. 5(c). Etched back was accomplished under the following conditions.

| Flow Rate of Gases | |
| --- | --- |
| | $CF_4/O_2$ = 100/8 [sccm] |
| Pressure | 339 [Pa] (300 mtorr) |
| RF | 450 [W] |

Then, a third insulating membrane 36 was laid thereon under the conditions of the first membrane 34 was laid so as to flatten the layer. The organic base may be selected from water soluble organic bases, such as ethyl amine and isopropyl amine, not limited by methyl amine.

Embodiment 6

In the present embodiment, a hydrazine derivative is added as a basic catalyst and the $H_2O$-TEOS plasma CVD apparatus is utilized. The catalyst catalyzes a reaction of TEOS to a product having high molecular weight on the wafer surface. Dehydration condensation of $H_2O$-TEOS is effectively promoted to form insulating membranes having good quality.

Referring now to FIG. 4(a), as a construction of layers is similar to that of the Embodiment 4, a wafer was prepared by a semiconductor substrate 21 of silicone or such materials on which an interlayer insulating membrane 22 formed of oxidized silicone or such materials and an layer of aluminum wiring 23. A first insulating membrane 24 was laid on the wafer, as shown in FIG. 4(b) to support quality of a plasma CVD membrane succeedingly laid by addition of an alkali solution.

Then, a second insulating membrane 25 was laid on the first membrane 24 under the following conditions.

| Flow Rate of Gases | |
| --- | --- |
| | TEOS/$H_2O$/$N_2H_4$ = 150/100/10 [sccm] |
| Pressure | 1330 [Pa] (10 torr) |
| Temperature | 150 [°C.] |
| RF | 350 [W] |

Next, a third insulating membrane 26 was laid thereon, as shown in FIG. 4(d), under the conditions similar as the first membrane 24 was laid. The organic silicone compound may be selected from OMCTS (octamethyl cyclotetrasiloxane), TPOS (tetrapropoxysilane), and TMCTS (tetramethyl cyclotetrasiloxane), not limited by tetraethoxysilane. Additionally, in the present embodiment, hydrazine derivative were mixed with the gaseous materials prior to introduction in the reaction chamber. However, individual introduction of those may be preferable to prevent particles generation using the apparatus in FIGS. 1 to 3.

Embodiment 7

The second insulating membrane prepared by the Embodiment 6 was etched back. Thus, the membrane was remained only at the clearance of the wiring by removal of an excess amount thereof on the surface of the wiring layer. Because the second membrane has less quality than the interlayer insulating membranes conventionally formed. Referring now to FIG. 5(a), as a construction of layers is similar to that of the Embodiment 5, a wafer was prepared by a semiconductor substrate 31 formed of silicone or such materials on which a layer of an insulating membrane 32 of oxidized silicone or such materials and a layer of an aluminum wiring 33 are successively formed. The aluminum wiring layer 33 was etched by a resist process.

Then, a first insulating membrane 34 was laid, as shown in FIG. 5(b), similar to that of the Embodiment 6. A solution of methyl hydrazine as the hydrazine derivative was supplied to the chamber. A second insulating membrane 35 was laid thereon under the following conditions.

| Flow Rate of Gases | |
| --- | --- |
| | TEOS/$H_2O$/$CH_3N_2H_3$ = 150/100/10 [sccm] |
| Pressure | 1330 [Pa] (10 torr) |
| Temperature | 150 [°C.] |
| RF | 350 [W] |

Next, an excess amount of the second membrane 35 was removed by etching. The layer 35 was only remained at the clearance of the aluminum wiring layer 33, as shown in FIG. 5(c). Etched back was accomplished under the following conditions.

| Flow Rate of Gases | |
| --- | --- |
| | $CF_4/O_2$ = 100/8 [sccm] |
| Pressure | 339 [Pa] (300 mtorr) |
| RF | 450 [W] |

Then, a third insulating member 36 was laid thereon under the conditions of the first layer 34 was laid to flatten the layer. The hydrazine derivative may be selected from water soluble hydrazine derivatives, such as dimethyl hydrazine, trimethyl hydrazine, and ethyl hydrazine, not limited by methyl hydrazine.

Embodiment 8

Referring to FIG. 4(a), as a construction of layers is similar to that of the Embodiment 4, a wafer was prepared by a semiconductor substrate 21 of silicone or such materials on which an interlayer insulating membrane 22 formed of oxidized silicone or such materials and an layer of an aluminum wiring 23. A first insulating membrane 24 was laid on the wafer by the conventional process using tetraethoxysilane as shown in FIG. 4(b) to support quality of a plasma CVD membrane succeedingly laid by addition of an alkali solution.

Then a second insulating membrane 25 was laid thereon using the apparatus of FIG. 1 under the following conditions;

Flow Rate of Gases

| | |
|---|---|
| TEOS/H$_2$O/NH$_3$ = | 150/100/10 [sccm] |
| Pressure | 1330 [Pa] (10 torr) |
| Temperature | 150 [°C.] |
| RF | 350 [W] |

Accordingly, quality of the second insulating membrane 25 can be improved by such regulation of mixed ratio between TEOS and ammonia.

Next, a third insulating membrane 26 was laid thereon, as shown in FIG. 4(d), by the conventional process. Although tetraethoxysilane was supplied to the chamber to form the interlayer membrane, any organic silicone compounds of an insulating membrane formable may be selected, such as OMCTS (octamethyl cyclotetrasiloxane), TPOS (tetrapropoxysilane), and TMCTS (tetramethyl cyclotetrasiloxane). Additionally the basic compound added as the catalyst of the reaction is not limited by the compound as the aforementioned.

Embodiment 9

The second insulating membrane prepared by the Embodiment 8 was etched back. Thus, the membrane was remained only at the clearance of the wiring by removal of an excess amount thereof on the surface of the wiring layer. Because the second membrane has less quality than the interlayer insulating membranes conventionally formed. Referring now to FIG. 5(a), as a construction of layers is similar to that of the Embodiment 5, a wafer was prepared by a semiconductor substrate 31 formed of silicone or such materials on which a layer of an insulating membrane 32 of oxidized silicone or such materials and a layer of an aluminum wiring 33 are successively formed. The aluminum wiring layer 33 was etched by a resist process.

Then, a first insulating membrane 34 was laid, as shown in FIG. 5(b), similar to that of the embodiment 8. Water and an organic gas having basicity was supplied to the chamber. An second insulating membrane 35 was laid thereafter.

Next, an excess amount of the second membrane 35 was removed by conventional etching. The layer 35 was only remained at the clearance of the aluminum wiring 33 as shown in FIG. 5(c).

Conditions of conventionally forming of the first and the third membranes 34 and 36 were determined as follows.

Flow Rate of Gases

| | |
|---|---|
| TEOS/O$_2$ = | 350/350 [sccm] |
| Pressure | 1330 [Pa] (10 torr) |
| Temperature | 390 [°C.] |
| RF | 350 [W] |

The organic base may be selected from water soluble organic bases, such as ethyl amine and isopropyl amine, not limited by methyl amine.

According to the present embodiment, a self-flowing of the membrane can be occurred because the second insulating membrane 35 was made by the gaseous materials including water as an oxidant and the organic silicone compound. Additionally, membrane quality of the second insulating membrane 35 can be supported by the first and third membranes 34 and 36 because those were made by the conventional process and gave good quality.

According to the apparatus of the present invention, at least one of gaseous materials are supplied to the reaction chamber via the gas supply conduit individually from that of the catalyst is supplied. Therefore, the catalyst is not allowed to react with the gases till membrane formation is started in the reaction chamber. Membrane quality can be improved thereby. Additionally, gaseous materials includes at least one organic silicone compound, reaction rate of dehydration condensation can be increased compared to that of hydrolysis.

Dehydration condensation can be significantly increased by the catalyst which is selected from the basic compound having amino groups. Therefore, the membrane having high molecular weight can be obtained to improve step coverage by the self-flowing thereof to allow flattening of the membranes. Addition of the basic catalyst can reduces concentration of hydroxyl groups present in the insulating membranes. Thereby, rate of shrinkage caused by heat treatment and hygroscopicity of the membranes can be controlled to low levels.

Accordingly, reliability of a semiconductor device of which wirings are microrized and multilayered can be highly improved.

When the basic catalyst is supplied to the reaction chamber as a solution by the bubbling process, similar effects as the aforementioned can be obtained.

According to another aspect of the present invention, layers of the first and the third insulating membranes are prepared by the CVD process using gaseous materials free from water. Therefore, concentrations of hydroxyl groups present in the membranes and alcohol by-produced is reduced to allow the less heat shrinkage during annealing without cracks on the membrane. Additionally, the second insulating membrane is made by the CVD process using materials including the organic silicone compound gas and an oxidant, e.g., water. Therefore, the second membrane can be flattened. Though quality of the second membrane is not so high, it can be supported by the layers of the first and the third insulating membranes. Therefore, desorption of gases from the second membrane can be reduced.

While the present invention has been disclosed in terms of the preferred embodiment in order to facilitate better understanding of the invention, it should be appreciated that the invention can be embodied in various ways without depending from the principle of the invention. Therefore, the invention should be understood to include all possible embodiments and modification to the shown embodiments which can be embodied without departing from the principle of the inventions as set forth in the appended claims.

What is claimed is:

1. A process for forming a semiconductor device comprising:

providing a wafer including a semiconductor substrate having an oxidized silicone insulating layer thereon having aluminum wirings including clearances defined thereon;

forming a first insulating interlayer on said aluminum wirings and insulating layer by a chemical vapor deposition process wherein a gaseous material including at least one organic silicone compound and free from water is introduced into a reaction chamber containing said wafer until membrane formation is started and thereafter introducing a dehydration condensation catalyst into said reaction chamber to provide a high molecular weight first insulating interlayer on said wafer having a reduced concentration of hydroxyl groups as compared to a similar interlayer formed by hydrolysis;

forming a second insulating interlayer on said first insulating interlayer by a chemical vapor deposition process wherein a gaseous material including at least one organic silicone compound, an oxidant and a dehydration condensation catalyst are introduced into the reaction chamber and reacted until a second insulating interlayer is formed on the wafer;

etching said second insulation interlayer back so that said second insulating interlayer remains only in the clearances of the wirings; and thereafter forming a third insulating interlayer on said wafer by a chemical vapor deposition process wherein a gaseous material including at least one organic silicone compound and free from water is introduced into a reaction chamber containing said wafer until membrane formation is started and thereafter introducing a dehydration condensation catalyst into said reaction chamber to provide a high molecular weight third insulating interlayer on said wafer having a reduced concentration of hydroxyl groups as compared to a similar interlayer formed by hydrolysis;

whereby said wafer may be annealed with less shrinkage and cracking to provide an improved semiconductor device.

2. A process as defined in claim 1, wherein said at least one organic silicone compound is selected from the group consisting of alkoxysilanes, alkoxyacetoxysilanes, chain polysiloxanes and cyclic polysiloxanes.

3. A process as defined in claim 1, wherein the dehydration condensation catalyst is selected from the group consisting of ammonia, alkylamines and water soluble hydrazine derivatives.

4. A process as defined in claim 1, wherein said oxidant is water.

5. A process as defined in claim 1, wherein said chemical vapor deposition processes are performed at temperatures of from 100° C. to 200° C.

* * * * *